(12) United States Patent
Liu et al.

(10) Patent No.: US 8,350,728 B2
(45) Date of Patent: Jan. 8, 2013

(54) KEYBOARD WITH INTEGRATED AND NUMERIC KEYPAD

(75) Inventors: Eric Liu, Santa Clara, CA (US);
Manjirnath Chatterjee, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 347 days.

(21) Appl. No.: 12/766,828

(22) Filed: Apr. 23, 2010

(65) Prior Publication Data

US 2011/0260891 A1 Oct. 27, 2011

(51) Int. Cl.
*H03M 11/00* (2006.01)

(52) U.S. Cl. ............ 341/22; 341/23; 345/168; 345/169; 345/170; 345/171; 345/172

(58) Field of Classification Search .................. 341/22, 341/23; 345/168–172
See application file for complete search history.

(56) References Cited

U.S. PATENT DOCUMENTS

| | | |
|---|---|---|
| 1,718,694 A | 6/1929 | Kurowski |
| 3,396,827 A | 8/1968 | Harwell |
| 3,744,034 A | 7/1973 | Paul |
| 3,937,952 A | 2/1976 | Ripley et al. |
| 4,022,993 A | 5/1977 | Shattuck |
| 4,060,703 A | 11/1977 | Everett |
| 4,180,336 A | 12/1979 | Lonsdale |
| 4,196,666 A | 4/1980 | Kobayashi et al. |
| 4,237,351 A | 12/1980 | Boulanger et al. |
| 4,320,268 A | 3/1982 | Brown |
| 4,359,612 A | 11/1982 | Rooney |
| 4,359,613 A | 11/1982 | Rooney |
| 4,559,705 A | 12/1985 | Hodge et al. |
| 4,564,751 A | 1/1986 | Alley et al. |
| RE32,419 E | 5/1987 | Rooney |
| 4,679,951 A | 7/1987 | King et al. |
| 4,762,227 A | 8/1988 | Patterson |
| 4,802,210 A | 1/1989 | Spencer et al. |
| 4,847,798 A | 7/1989 | Kurashima |
| 4,860,372 A | 8/1989 | Kuzunuki et al. |
| 4,916,441 A | 4/1990 | Gombrich |
| 4,972,051 A | 11/1990 | Hodsdon |
| 4,972,496 A | 11/1990 | Sklarew |

(Continued)

FOREIGN PATENT DOCUMENTS

DE 10203400 6/2003
(Continued)

OTHER PUBLICATIONS

U.S. Appl. No. 12/395,535, filed Mar. 16, 2009, Skillman et al.

(Continued)

*Primary Examiner* — Linh Nguyen
(74) *Attorney, Agent, or Firm* — Mahamedi Paradice Kreisman LLP; Van Mahamedi

(57) ABSTRACT

A keypad includes a plurality of keys, and a processor that is coupled to control use of the keypad, including to enable use of the keypad in each of a letter entry mode or an alternative entry mode. The plurality of keys include a subset of keys, each key in the subset being (i) enlarged as compared to other keys of the keypad that are not part of the subset, (ii) assigned m letter values for when the keypad is operated in the letter entry mode, and (iii) assigned n numeric values, where $1 \leq n < m$, for when the keypad is operated in the alternative entry mode.

19 Claims, 5 Drawing Sheets

U.S. PATENT DOCUMENTS

| | | | |
|---|---|---|---|
| D312,628 S | 12/1990 | Yokoi et al. | |
| D313,401 S | 1/1991 | Tanabe | |
| D313,413 S | 1/1991 | Langton | |
| 4,994,992 A | 2/1991 | Lapeyre | |
| 5,002,184 A | 3/1991 | Lloyd | |
| 5,040,296 A | 8/1991 | Yerger | |
| 5,049,862 A | 9/1991 | Dao et al. | |
| 5,067,573 A | 11/1991 | Uchida | |
| 5,107,739 A | 4/1992 | Muramatsu et al. | |
| 5,128,829 A | 7/1992 | Loew | |
| 5,138,119 A | 8/1992 | Demeo | |
| 5,165,415 A | 11/1992 | Wallace et al. | |
| 5,180,891 A | 1/1993 | Trumbo | |
| 5,181,029 A | 1/1993 | Kim | |
| 5,205,017 A | 4/1993 | Wang | |
| 5,231,381 A | 7/1993 | Duwaer | |
| 5,253,142 A | 10/1993 | Weng | |
| 5,274,371 A | 12/1993 | Yang et al. | |
| 5,280,283 A | 1/1994 | Raasch et al. | |
| 5,283,862 A | 2/1994 | Lund | |
| 5,305,394 A | 4/1994 | Tanaka | |
| D355,165 S | 2/1995 | Sakaguchi et al. | |
| 5,389,745 A | 2/1995 | Sakamoto | |
| 5,401,917 A | 3/1995 | Yoshida et al. | |
| 5,401,927 A | 3/1995 | Lundell et al. | |
| 5,410,141 A | 4/1995 | Koenck et al. | |
| 5,426,449 A | 6/1995 | Danziger | |
| D359,920 S | 7/1995 | Sakamoto | |
| 5,430,248 A | 7/1995 | Levy | |
| 5,434,929 A | 7/1995 | Beernink et al. | |
| D361,562 S | 8/1995 | Beltz | |
| 5,444,192 A | 8/1995 | Shetye et al. | |
| 5,448,433 A | 9/1995 | Morehouse et al. | |
| 5,452,371 A | 9/1995 | Bozinovic et al. | |
| 5,457,454 A | 10/1995 | Sugano | |
| D366,463 S | 1/1996 | Ive et al. | |
| 5,489,924 A | 2/1996 | Shima et al. | |
| D368,079 S | 3/1996 | Ive et al. | |
| 5,500,643 A | 3/1996 | Grant | |
| 5,506,749 A | 4/1996 | Matsuda | |
| 5,515,045 A | 5/1996 | Tak et al. | |
| 5,515,763 A | 5/1996 | Vandervoort | |
| 5,528,743 A | 6/1996 | Tou et al. | |
| 5,530,234 A | 6/1996 | Loh et al. | |
| 5,534,892 A | 7/1996 | Tagawa | |
| 5,548,477 A | 8/1996 | Kumar et al. | |
| 5,550,715 A | 8/1996 | Hawkins | |
| 5,555,157 A | 9/1996 | Moller et al. | |
| 5,563,631 A | 10/1996 | Masunaga | |
| 5,564,850 A | 10/1996 | Nagaoka | |
| 5,576,502 A | 11/1996 | Fukushima et al. | |
| 5,606,712 A | 2/1997 | Hidaka | |
| 5,611,031 A | 3/1997 | Hertzfeld et al. | |
| 5,615,284 A | 3/1997 | Rhyne et al. | |
| 5,621,817 A | 4/1997 | Bozinovic et al. | |
| 5,622,789 A | 4/1997 | Young | |
| 5,630,148 A | 5/1997 | Norris | |
| 5,635,682 A | 6/1997 | Cherdak et al. | |
| 5,638,257 A | 6/1997 | Kumar et al. | |
| 5,642,110 A | 6/1997 | Raasch et al. | |
| D381,021 S | 7/1997 | Williams et al. | |
| 5,646,649 A | 7/1997 | Iwata et al. | |
| 5,657,459 A | 8/1997 | Yanagisawa et al. | |
| 5,661,641 A | 8/1997 | Shindo | |
| D383,756 S | 9/1997 | Henderson et al. | |
| 5,682,182 A | 10/1997 | Tsubodaka | |
| 5,698,822 A | 12/1997 | Haneda et al. | |
| D390,509 S | 2/1998 | Antzinas et al. | |
| 5,717,565 A | 2/1998 | Raasch | |
| D392,968 S | 3/1998 | Johansson | |
| 5,737,183 A | 4/1998 | Kobayashi et al. | |
| D394,449 S | 5/1998 | Shimizu | |
| 5,757,681 A | 5/1998 | Suzuki et al. | |
| 5,760,347 A | 6/1998 | Notarianni et al. | |
| 5,767,464 A | 6/1998 | Dyer et al. | |
| 5,786,061 A | 7/1998 | Banfield | |
| 5,797,482 A | 8/1998 | La Pointe et al. | |
| D398,307 S | 9/1998 | Collins | |
| 5,805,157 A | 9/1998 | Bertram et al. | |
| 5,805,402 A | 9/1998 | Maue et al. | |
| 5,810,461 A | 9/1998 | Ive et al. | |
| 5,818,437 A | 10/1998 | Grover et al. | |
| 5,821,510 A | 10/1998 | Cohen et al. | |
| 5,825,353 A | 10/1998 | Will | |
| 5,831,555 A | 11/1998 | Yu et al. | |
| 5,831,613 A | 11/1998 | Johnston et al. | |
| 5,832,764 A | 11/1998 | Girard | |
| 5,841,901 A | 11/1998 | Arai et al. | |
| D402,572 S | 12/1998 | Han | |
| 5,847,336 A | 12/1998 | Thornton | |
| 5,848,298 A | 12/1998 | Steere, Jr. et al. | |
| 5,889,512 A | 3/1999 | Moller et al. | |
| D408,021 S | 4/1999 | Haitani et al. | |
| 5,892,503 A | 4/1999 | Kim | |
| D411,179 S | 6/1999 | Toyosato | |
| D411,181 S | 6/1999 | Tamaki et al. | |
| 5,913,629 A | 6/1999 | Hazzard | |
| 5,914,708 A | 6/1999 | La Grange et al. | |
| 5,915,228 A | 6/1999 | Kunihiro et al. | |
| 5,941,648 A | 8/1999 | Robinson et al. | |
| 5,942,177 A | 8/1999 | Banfield | |
| 5,949,408 A | 9/1999 | Kang et al. | |
| 5,953,205 A | 9/1999 | Kambayashi et al. | |
| 5,973,621 A | 10/1999 | Levy | |
| D416,001 S | 11/1999 | Tal et al. | |
| D416,256 S | 11/1999 | Griffin et al. | |
| 5,975,711 A | 11/1999 | Parker et al. | |
| 5,995,026 A | 11/1999 | Sellers | |
| D417,657 S | 12/1999 | Matsumoto | |
| 6,014,009 A | 1/2000 | Wierzbicki et al. | |
| D420,351 S | 2/2000 | Waldner | |
| D420,987 S | 2/2000 | Miyahara et al. | |
| 6,023,779 A | 2/2000 | Fullam et al. | |
| 6,034,685 A | 3/2000 | Kuriyama et al. | |
| D422,271 S | 4/2000 | Kawashima | |
| D423,468 S | 4/2000 | Jenkins | |
| 6,046,730 A | 4/2000 | Bowen et al. | |
| 6,049,796 A | 4/2000 | Siitonen et al. | |
| 6,050,735 A | 4/2000 | Hazzard | |
| 6,052,070 A | 4/2000 | Kivela et al. | |
| 6,052,279 A | 4/2000 | Friend et al. | |
| D424,533 S | 5/2000 | Kandalepas | |
| D426,236 S | 6/2000 | Kim et al. | |
| 6,088,022 A | 7/2000 | Rakoski | |
| 6,091,956 A | 7/2000 | Hollenberg | |
| 6,094,197 A | 7/2000 | Buxton et al. | |
| 6,100,875 A | 8/2000 | Goodman et al. | |
| 6,102,594 A | 8/2000 | Strom | |
| 6,102,721 A | 8/2000 | Seto et al. | |
| 6,103,979 A | 8/2000 | Motoyama et al. | |
| 6,107,997 A | 8/2000 | Ure | |
| 6,108,200 A | 8/2000 | Fullerton | |
| 6,115,248 A | 9/2000 | Canova et al. | |
| D432,511 S | 10/2000 | Eckholm | |
| D433,017 S | 10/2000 | Martinez | |
| 6,129,430 A | 10/2000 | Wu | |
| 6,148,261 A | 11/2000 | Obradovich et al. | |
| 6,151,012 A | 11/2000 | Bullister | |
| 6,151,206 A | 11/2000 | Kato et al. | |
| 6,157,323 A | 12/2000 | Tso et al. | |
| D436,591 S | 1/2001 | Abston et al. | |
| D436,963 S | 1/2001 | Kim et al. | |
| 6,170,024 B1 | 1/2001 | Wakeland et al. | |
| 6,172,620 B1 | 1/2001 | Brick et al. | |
| 6,178,087 B1 | 1/2001 | Cho et al. | |
| 6,181,284 B1 | 1/2001 | Madsen et al. | |
| 6,195,589 B1 | 2/2001 | Ketcham | |
| D440,542 S | 4/2001 | Hawkins et al. | |
| 6,212,412 B1 | 4/2001 | Rogers et al. | |
| 6,217,183 B1 | 4/2001 | Shipman | |
| D441,733 S | 5/2001 | Do et al. | |
| 6,239,968 B1 | 5/2001 | Kim et al. | |
| 6,243,789 B1 | 6/2001 | Hasbun et al. | |
| 6,246,169 B1 | 6/2001 | Pruvot | |
| 6,249,276 B1 | 6/2001 | Ohno | |
| 6,266,240 B1 | 7/2001 | Urban et al. | |
| 6,278,442 B1 | 8/2001 | Griffin et al. | |

| | | |
|---|---|---|
| 6,283,777 B1 | 9/2001 | Canova et al. |
| D451,079 S | 11/2001 | Ali |
| 6,348,878 B1 * | 2/2002 | Tsubai .................... 341/23 |
| D454,349 S | 3/2002 | Makidera et al. |
| D454,849 S | 3/2002 | Eckholm |
| 6,356,442 B1 | 3/2002 | Lunsford |
| 6,374,277 B2 | 4/2002 | Vong et al. |
| 6,377,685 B1 * | 4/2002 | Krishnan ............... 379/433.07 |
| D456,794 S | 5/2002 | Laverick et al. |
| 6,396,482 B1 | 5/2002 | Griffin et al. |
| D458,239 S | 6/2002 | Shim et al. |
| D459,327 S | 6/2002 | Ali |
| D460,068 S | 7/2002 | Lanzaro et al. |
| 6,423,918 B1 | 7/2002 | King et al. |
| 6,452,588 B2 | 9/2002 | Griffin et al. |
| 6,459,968 B1 | 10/2002 | Kochie |
| 6,489,950 B1 | 12/2002 | Griffin et al. |
| 6,507,336 B1 | 1/2003 | Lunsford |
| 6,528,741 B2 * | 3/2003 | Walker .................... 200/5 R |
| 6,533,963 B1 | 3/2003 | Schleifstein et al. |
| 6,535,199 B1 | 3/2003 | Canova, Jr. et al. |
| D472,551 S | 4/2003 | Griffin |
| D473,226 S | 4/2003 | Griffin |
| D476,985 S | 7/2003 | Griffin |
| D478,585 S | 8/2003 | Griffin |
| 6,609,805 B1 | 8/2003 | Nelson |
| 6,611,254 B1 | 8/2003 | Griffin et al. |
| 6,611,255 B2 | 8/2003 | Griffin et al. |
| 6,626,551 B2 | 9/2003 | Funamoto et al. |
| 6,641,315 B2 | 11/2003 | King et al. |
| 6,677,931 B2 | 1/2004 | Chi et al. |
| 6,679,613 B2 | 1/2004 | Mabuchi |
| 6,717,083 B2 | 4/2004 | Chen et al. |
| 6,724,892 B1 | 4/2004 | Mason et al. |
| D490,076 S | 5/2004 | Griffin |
| 6,747,402 B2 | 6/2004 | Hato et al. |
| 6,786,661 B2 | 9/2004 | King et al. |
| 6,808,325 B2 | 10/2004 | King et al. |
| D497,907 S | 11/2004 | Griffin |
| 6,867,763 B2 | 3/2005 | Griffin et al. |
| 6,873,317 B1 | 3/2005 | Griffin et al. |
| 6,891,529 B2 | 5/2005 | Ladouceur et al. |
| 6,918,707 B2 | 7/2005 | King et al. |
| 6,919,879 B1 | 7/2005 | Griffin et al. |
| 6,921,221 B2 | 7/2005 | King et al. |
| 6,923,583 B2 | 8/2005 | King et al. |
| 6,924,789 B2 | 8/2005 | Bick |
| 6,981,791 B2 | 1/2006 | Higashiyama |
| 7,027,036 B2 | 4/2006 | Yang |
| 7,129,433 B2 | 10/2006 | Tokusashi |
| 7,129,932 B1 * | 10/2006 | Klarlund et al. ............ 345/168 |
| 7,158,147 B2 | 1/2007 | Watson et al. |
| 7,216,588 B2 | 5/2007 | Suess |
| 7,227,536 B2 | 6/2007 | Griffin et al. |
| 7,250,937 B2 | 7/2007 | Takagi |
| 7,265,745 B1 | 9/2007 | Kling |
| 7,324,091 B2 * | 1/2008 | Fyke .................... 345/168 |
| 7,502,462 B2 | 3/2009 | Rak et al. |
| 7,511,700 B2 | 3/2009 | Skillman |
| 7,525,534 B2 | 4/2009 | Skillman et al. |
| 7,623,118 B2 | 11/2009 | Skillman et al. |
| 7,864,949 B2 * | 1/2011 | Pathiyal .................... 379/433.07 |
| 2001/0035333 A1 | 11/2001 | Takahashi |
| 2001/0038382 A1 | 11/2001 | Griffin et al. |
| 2002/0021562 A1 | 2/2002 | Tholin et al. |
| 2002/0025837 A1 | 2/2002 | Levy |
| 2002/0030987 A1 | 3/2002 | Saito et al. |
| 2002/0044136 A1 | 4/2002 | Griffin et al. |
| 2002/0079211 A1 | 6/2002 | Katayama et al. |
| 2002/0149567 A1 | 10/2002 | Griffin et al. |
| 2002/0175899 A1 | 11/2002 | Yang |
| 2002/0196618 A1 | 12/2002 | Douzono et al. |
| 2002/0196619 A1 | 12/2002 | Chou |
| 2003/0031025 A1 | 2/2003 | Huizenga |
| 2003/0054854 A1 | 3/2003 | Kela et al. |
| 2003/0063087 A1 | 4/2003 | Doyle et al. |
| 2003/0112620 A1 | 6/2003 | Prindle |
| 2003/0156381 A1 | 8/2003 | Lieu et al. |
| 2003/0197687 A1 | 10/2003 | Shetter |
| 2004/0165924 A1 | 8/2004 | Griffin |
| 2004/0227733 A1 * | 11/2004 | Fyke et al. .................... 345/168 |
| 2005/0105256 A1 | 5/2005 | Chuang |
| 2005/0140653 A1 | 6/2005 | Pletikosa et al. |
| 2005/0174334 A1 | 8/2005 | Hannay |
| 2005/0216278 A1 | 9/2005 | Eisen |
| 2005/0248537 A1 | 11/2005 | Kim et al. |
| 2005/0259069 A1 | 11/2005 | Baker et al. |
| 2006/0033704 A1 | 2/2006 | Ladouceur et al. |
| 2006/0146027 A1 | 7/2006 | Tracy et al. |
| 2006/0202966 A1 | 9/2006 | Skillman |
| 2006/0202968 A1 | 9/2006 | Skillman et al. |
| 2006/0204303 A1 | 9/2006 | Yurochko et al. |
| 2006/2004303 | 9/2006 | Yurochko et al. |
| 2007/0030249 A1 * | 2/2007 | Griffin et al. .................... 345/169 |
| 2007/0061754 A1 * | 3/2007 | Ardhanari et al. ............ 715/816 |
| 2007/0146332 A1 * | 6/2007 | Kim et al. .................... 345/170 |
| 2007/0200828 A1 | 8/2007 | Skillman et al. |
| 2007/0256915 A1 | 11/2007 | Levy |
| 2008/0211696 A1 * | 9/2008 | Griffin et al. .................... 341/22 |
| 2009/0186663 A1 * | 7/2009 | Griffin et al. .................... 455/566 |
| 2010/0231519 A1 * | 9/2010 | Cebe .................... 345/168 |
| 2011/0069831 A1 * | 3/2011 | Pathiyal .................... 379/433.07 |
| 2011/0248925 A1 * | 10/2011 | Bowen .................... 345/168 |
| 2012/0062386 A1 * | 3/2012 | Badali et al. .................... 340/635 |

FOREIGN PATENT DOCUMENTS

| | | |
|---|---|---|
| EP | 0760291 A2 | 3/1997 |
| EP | 1143327 A1 | 10/2001 |
| EP | 1172989 | 1/2002 |
| EP | 1197835 | 1/2002 |
| EP | 1265261 | 12/2002 |
| EP | 1585153 A1 | 10/2005 |
| EP | 1619705 A1 | 1/2006 |
| EP | 1859337 | 11/2007 |
| JP | 2001126588 | 5/2001 |
| WO | WO81/02272 | 8/1981 |
| WO | WO96/27256 | 9/1996 |
| WO | WO99/37025 A | 7/1999 |
| WO | WO00/30381 A | 5/2000 |
| WO | WO01/82042 | 11/2001 |
| WO | WO03/007582 | 1/2003 |
| WO | WO2004/001578 | 12/2003 |
| WO | WO2004/059955 | 7/2004 |
| WO | WO2006/099150 | 9/2006 |

OTHER PUBLICATIONS

U.S. Appl. No. 12/405,190, filed Feb. 27, 2009, Skillman et al.
HP iPAQ H4350 Keypad Structure, Mar. 3, 2006, 7 pages.
Final Office Action dated Jul. 21, 2010 in U.S. Appl. No. 11/080,375, 15 pages.
Final Office Action dated Jul. 12, 2010 in U.S. Appl. No. 11/364,813, 12 pages.
Final Office Action dated Dec. 28, 2007 in U.S. Appl. 11/080,375, 11 pgs.
International Preliminary Report on Patenability of the International Searching Authority in International Application PCT/US2006/008615, European Patent Office, Sep. 18, 2007, 14 pages.
International Search Report and Written Opinion of the International Searching Authority in International Application PCT/US2006/008615, European Patent Office, Mar. 16, 2007, 7 pages.
Nokia 9500 Up Close, from www.phonescoop.com, Jun. 27, 2006, 2 pages.
Non-Final Action dated Jan. 3, 2011 in U.S. Appl. No. 11/364,813, 8 pages.
Non-Final Office Action mailed Dec. 28, 2009 in U.S. Appl. No. 11/080,375 , 15 pages.
Non-Final Office Action mailed Dec. 22, 2009 in U.S. Appl. No. 11/364,813, 7 pages.
Non-Final Office Action dated Sep. 5, 2008 in U.S. Appl. 11/080,375, 12 pgs.
Palm Treo 500v, announced Sep. 2007, http://www.gsmarena.com/palm_treo_500v-2100.php.
V BenQ-Siemens EF51, announced Feb. 2006, http://www.gsmarena.com/benq_siemens_ef51-1436.php.

* cited by examiner

KEYBOARD WITH INTEGRATED AND NUMERIC KEYPAD

TECHNICAL FIELD

Embodiments described herein pertain generally to keyboards and keypads for computing devices, and more specifically, to a keyboard with an integrated numeric keypad.

BACKGROUND

Many computing devices include small-form factor keypads and keyboards. Conventional small-form factor keypads or keyboards often work well for text entry, but typically require additional effort for numeric entry. For example, in order to enter numeric mode, the user typically has to either shift before hitting each key with an alternative numeric value, or shift lock before initiating the alternative numeric sequence. In many cases, the number keys on a standard keyboard are typically clustered (such as in a 12-key format), where each number key is shared with one letter. The active character depends on the software mode of the device. However, the buttons are still small and not centered in the device. Also, the visual clutter of the rest of the keys make it difficult to do simple number entry.

DETAILED DESCRIPTION

Embodiments provide for a keypad for use on or with an electronic device, such as a mobile computing device. The keypad includes a plurality of keys, and a processor that is coupled to control use of the keypad, including to enable use of the keypad in each of a letter entry mode or an alternative entry mode. The plurality of keys include a subset of keys, each key in the subset being (i) enlarged as compared to other keys of the keypad that are not part of the subset, (ii) assigned m letter values for when the keypad is operated in the letter entry mode, and (iii) assigned n numeric values, where $1 \leq n < m$, for when the keypad is operated in the alternative entry mode.

According to some embodiments, a keypad includes a set of enlarged keycaps which individually provide two letters or letter keys and one number key. The subset of enlarged keys are provided a number graphic that is larger and more visible than graphics used for regular size keys or letters on the enlarged keycaps. Thus, the two letter keys share one keycap that is, for example, double the size of other keys that comprise the keypad. When the device is in number-entry mode, a press on any part of the large key results in a number entry. When the device is in letter-entry mode, the device can distinguish between a press on the left side of the large key and a press on the right side of the large key. Such an embodiment enhances the usability of the numeric portion of the keypad, allowing the numeric portion to be larger. Moreover, the numeric portion may be on the keypad while maintaining the usability of the keyboard for letter entry.

In some embodiments, the number keys can be emphasized or de-emphasized by usage of selective lighting or a display technology.

Key Structure

Figure 1A:
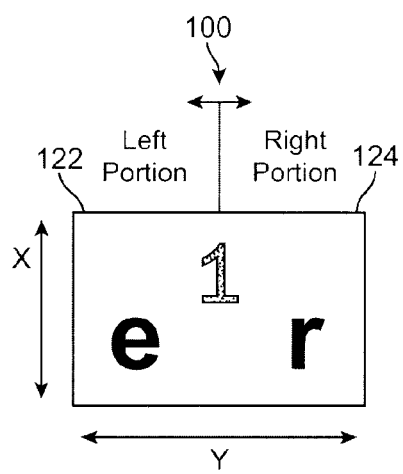
FIG. 1A and FIG. 1B illustrate a key structure for providing a key of a keypad, according to embodiments described herein.
Figure 1B:
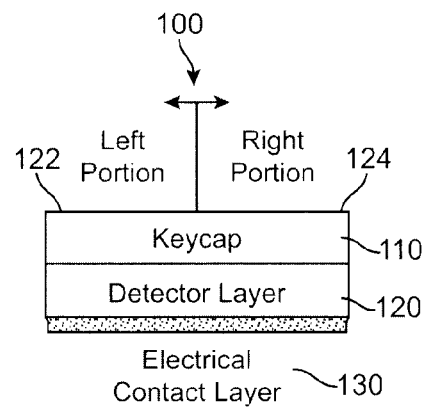

FIG. 1A and FIG. 1B illustrate a key structure for providing a key of a keypad, according to embodiments described herein. As will be described, embodiments include a keypad that incorporates a key structure such as represented by FIG. 1A and FIG. 1B, in order to provide some of the keys that comprise the keypad. While numerous context and applications are contemplated, some embodiments incorporate key structures and keypad arrangements such as described into small form-factor keypads on multifunctional handsets, such as used for cellular telephony messaging and mobile web browsing (e.g. smart phones).

According to some embodiments, key structure 100 includes a keycap 110 that overlays a detector layer 120 and an electrical contact layer 130. The keycap 110 forms the outer portion of the overall key structure 100, so as to provide an exterior contact surface for the user. The user can touch or press the keycap to enter both letter and numeric inputs.

Generally, the keycaps of a keypad are assigned to one or more alphanumeric values, so that individual key strikes on the keycap result in a corresponding one of the assigned values being registered as input. Under an embodiment shown, the keycap 110 is assigned to m different letter values ('e' and 'r' in the example shown), and n numeric values ('1') in the example shown, where $1 \leq n < m$. In the specific example shown, the keycap 110 has two letter assignments and one numeric assignment. The computing device (not shown in FIG. 1A and FIG. 1B) may enable operation of the keypad or its individual keys in various modes, including a letter entry mode and an alternative entry mode in which numeric values are recognized. In the letter entry mode, one of the two assigned letters is registered as the input value. In the alternative entry mode, the numeric value is registered as the input value.

According to some embodiments, the detector layer 120 includes one or more detectors that detect (i) when the keycap 110 is contacted to enter input, and (ii) which portion of keycap 110 is contacted. By detecting which portion of the keycap 110 is contacted, processing resources (see FIG. 6) of the computing device are able to determine which assigned value to register for the user input. For example, with reference to FIG. 1A and FIG. 1B, the key structure (or keypad assembly on which the key structure resides) can include detectors 130 that detect whether the key strike was on a left portion 122 or right portion 124 of the keycap. If the contact was on the left portion 122 and the device is in letter entry mode, the user contact is registered as the value assigned to that portion of the keycap (e.g. 'e'). If the contact was on the right portion 124 and the device is in letter entry mode, the user contact is registered as the value assigned to the right portion ('r'). In variations, additional portions or regions of the keycap may be assigned to other values (e.g. center portion could be assigned to a third value).

In the example shown, only the letter entry mode includes character assignments to different portions of the keycap. The alternative or numeric entry mode is shown to recognize only one character—the number '1' when user contact is made with either the left portion 122 or right portion 124. In other variations, more than one alternative (e.g. numeric) character can be assigned to a keycap, with three or more letter values assigned to the same keycap.

Figure 1C:
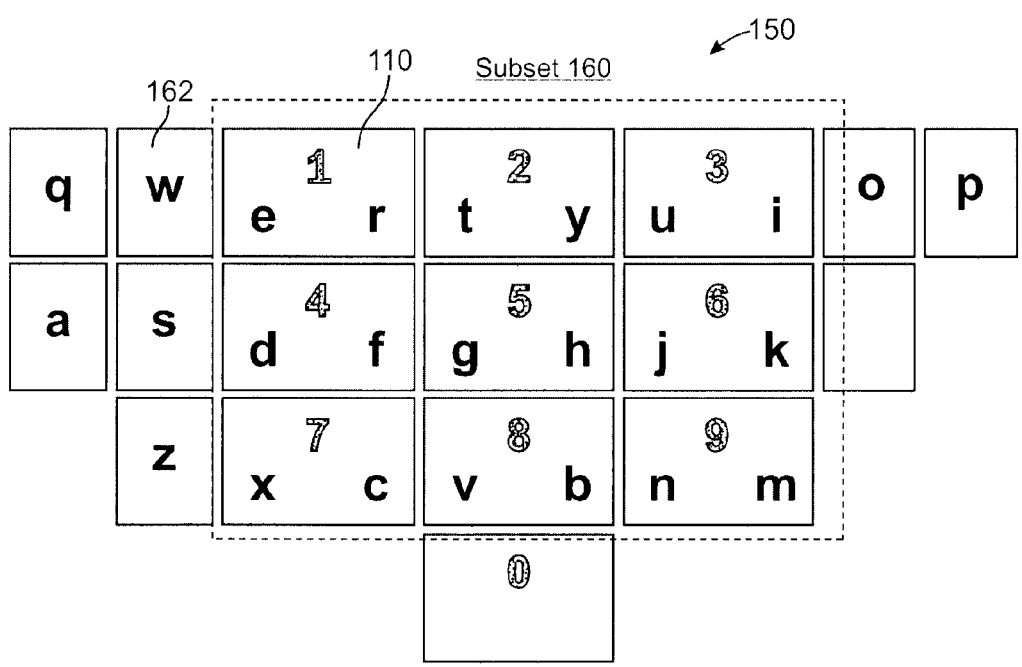
FIG. 1C illustrates a keypad 150 that incorporates a sub-set of keys 160 that correspond to the key structure 100 of FIG. 1A, according to one or more embodiments.

FIG. 1C illustrates a keypad 150 that incorporates a sub-set of keys 160 that correspond to the key structure 100 of FIG. 1A, according to one or more embodiments. The subset 160 of keys are distinguished in size and layout from other key structures on the keypad. In particular, the keycaps 110 of subset 160 are enlarged as compared to other keys 162 that comprise the keypad. The dimensions of the keycaps 110 (FIG. 1A) that form the subset can be referenced by dimensions X and Y (see FIG. 1A), and either one or both of the dimensions X, Y of each keycap is enlarged as compared to other keys 162 of the keypad 150 that are not in the subset 160. As described with an embodiment of FIG. 1A, each key structure 100 that comprises the subset 160 can carry two letter values and one numeric value. In this way, the numeric value is provided on a single enlarged keycap, enabling the keypad to provide larger keys for use in numeric entries. The particular arrangement of keys that form the subset may be provided in a dialpad arrangement, in which values 1-9 are provided in three rows, and the number 0 is provided underneath. Other keys 162 outside of the subset provide remaining keys of the QWERTY keyboard, including letter keys that do not have alternative numeric values (but may have other special character values), special character keys (e.g. '@') and functional keys (e.g. return key, mode selection keys, space bar).

In addition to size, some embodiments provide that key structures 100 of the key subset 160 are relatively centered. In, for example, a QWERTY arrangement, a first row of the key subset 160 can be positioned two or more keys in from each of a left and right boundary of the keypad.

As additions or alternatives, key structures 100 that comprise the subset 160 are provided with tactile and/or visual differentiators, in order to separate the keys that also comprise the number pad from those keys that do not. In particular, some embodiments provide that individual key structures of the subset 160 includes texture or surface features that distinguish those keys from other keys of the keypad 150 by touch or feel. Surface features, such as bumps, ridges, or recesses can also be used to highlight the left portion (or corresponding letter value) from the right portions (or corresponding letter value) for individual key structures of the subset 160. Such features enable, for example, a user to select and locate with touch either a left or right portion of any one of the keys in the subset 160 in order to specify a desired letter entry.

As shown by some embodiments described below, individual key structures of the keypad or keypad subset can also be illuminated to visually isolate letter values from numeric or alternative values. Other features that may be provided with some or all of the individual key structures include haptic feedback and/or computer generated content.

Still further, while the embodiments described with FIG. 1A through FIG. 1C are provided in the context of a physical keypad, other embodiments may render the keypad 150 as a computer-generated feature on a display screen of the computing device.

As an alternative or addition to an embodiment such as shown in FIG. 1A, the non-numeric characters of an enlarged keycap may be enlarged (or made larger as compared to the numeric characters). For example, with reference to FIG. 1A, the enlarged keycap 110 that carries the numerical value "1" may dimension the numerical value to be smaller than the character values "e" and "r". Similar dimensioning of the numeric versus non-numeric keys may be provided on some or all of the other enlarged keycaps.

With further reference to embodiments such as described with FIG. 1A through FIG. 1C (or elsewhere), the character values assigned to individual keys, and more particularly to enlarged keys, may vary in number and type. For example, non-numeric keys may include symbols, and enlarged keys may be provided three or more character assignments (e.g. two letter assignments, one symbol, one number) that can be displayed concurrently or otherwise.

Illumination

Some embodiments recognize that illumination can be used to visually isolate or separate (i) the display of letter values from numeric values, including on keys that carry both letter and numeric values, and/or (ii) the display of numeric values of keys from letter values on keys that carry both letter and numeric values.

Figure 2A:
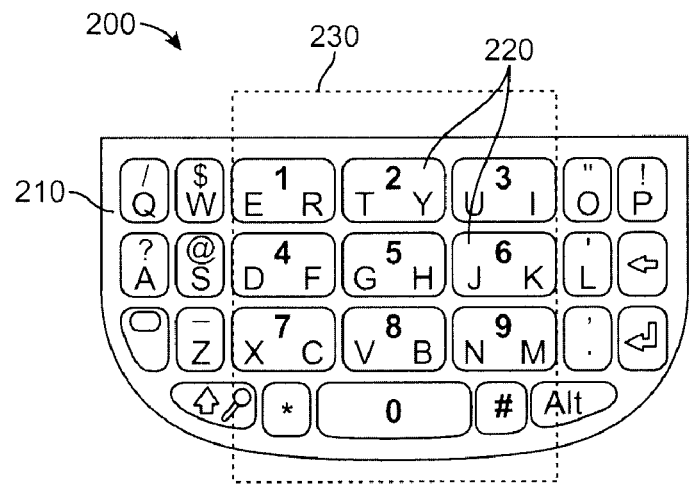
FIG. 2A through FIG. 2E illustrates a keypad on a mobile computing device that is illuminated to provide visual separation or isolation for letter and/or numeric entry modes of operation, according to one or more embodiments.

FIG. 2A through FIG. 2E illustrate a keypad on a mobile computing device that is illuminated to provide visual separation or isolation for letter and/or numeric entry modes of operation, according to one or more embodiments. With reference to FIG. 2A, a keypad 200 is provided on a computing device, such as a multipurpose handset (e.g. cellular telephony/messaging device). The keypad 200 is provided on a housing, and formed from keys 220. The keys 220 may be constructed in accordance with embodiments such as described with FIG. 1A through FIG. 1C. Thus, for example, the individual keys 220 may be provided by exterior surfaces of key caps, structured over a detector layer (e.g. sensor or switch) and interconnected to the processor of the mobile computing device. The keys are constructed so that individual keys can be illuminated to provide key content to identify the value or values assigned to each key. Different techniques or configurations can be used to provide the key content of the individual keys for embodiments such as shown. In one embodiment, key content may be formed by illuminating the individual keys from underneath, while imprinting possible key values on a surface of the key. In other embodiments, the key content is provided by forming the individual keys on a LCD or other contact generating display surface of the computing device, and causing the display surface to illuminate in a manner that generates key content, including letter and/or numeric value assignments of individual keys.

With further reference to FIG. 2A, keypad 200 includes an illumination state in which individual keys display both letter and alternative values of their respective key-value assignments. A subset 230 of keys includes alternative numeric value key assignments. As shown, the subset 230 can have a dialpad orientation, in which the number values are provided in a 3×3 arrangement. The illumination state shown by FIG. 2A corresponds to a default state for the keypad.

Figure 2B:
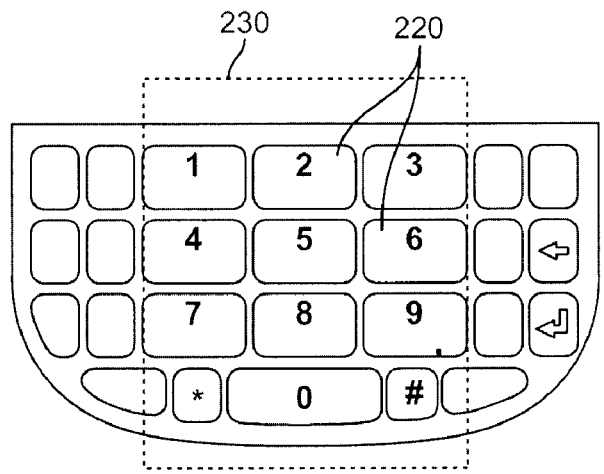

FIG. 2B illustrates an illumination state for when the keypad is operated in a numeric entry mode. According to an embodiment, when the keypad is operated in the numeric entry mode, (i) the numeric value assignments of the keys that comprise the subset 230 are illuminated, (ii) the letter value assignments of all keys that comprise the keypad 200 are not illuminated. The effect is that the keypad only displays a dialpad. In the example shown, the non-illuminated values of the individual keys are blacked-out, or otherwise made relatively non-visible.

Figure 2C:
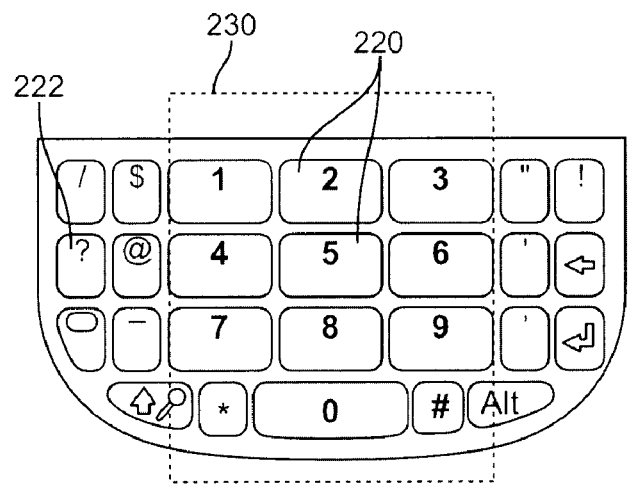

Numerous variations to the illumination state of FIG. 2B are possible. For example, as illustrated by FIG. 2C, when the keypad 200 is operated in the numeric entry mode, the letter value assignments of keys 220 that comprise the subset 230 lack illumination, while other keys 222 (outside of the subset 230) of the keypad maintain some illumination or presentation of letter and/or alternative key values. As another variation, in the display state in which numeric values of keys that comprise the subset 230 are illuminated, other keys and key values may lack illumination, but still be visible in the non-illuminated state.

Figure 2D:
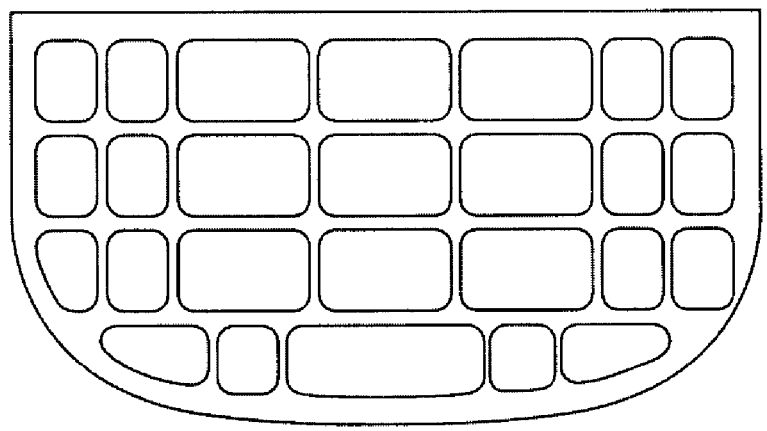

FIG. 2D illustrates an alternative illumination state in which no key values are illuminated, according to an embodiment. In one embodiment, the non-illumination may take the form of blacking out the otherwise visible aspects of the individual keys. Alternatively, the non-illumination can take the form of darkening the various key values of the keypad.

Figure 2E:
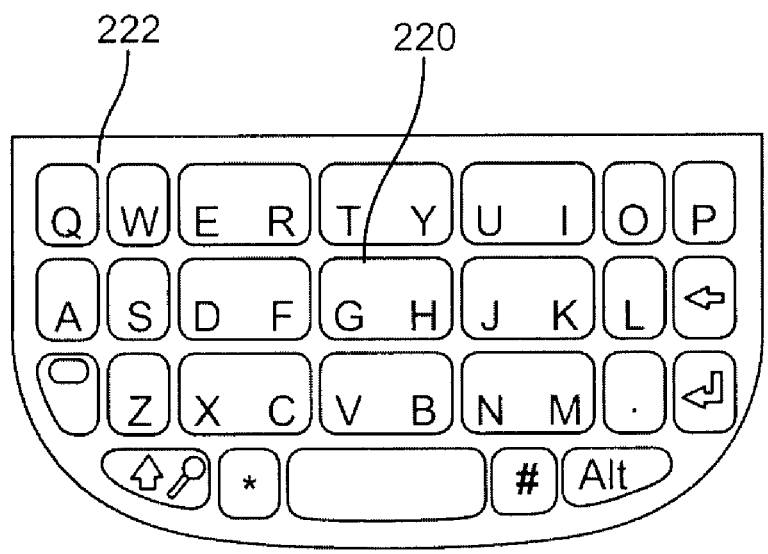

FIG. 2E illustrates an illumination or display state for when the keypad is operated in a letter entry mode. According to some embodiments, in letter entry mode, illumination results in (i) display of letter value assignments, so that all of the letter values of the keys 220, 222 are displayed, and (ii) non-illumination of alternative values, including non-illumination numeric value assignments of keys 220 that comprise the subset 230.

As mentioned with other embodiments, various alternatives and variations are possible for providing a similar illumination state. For example, rather than not illuminate all alternative key value assignments, only the numeric value assignments at the keys that comprise the subset may be non-illuminated. Furthermore, while non-illumination may result in blackening or making non-visible to various alternative key value assignments, non-illumination may also take the form of darkening or shading such alternative key value assignments.

With reference to an embodiment such as described with FIG. 2E, as an alternative or variation to illumination, or selective illumination, character value assignments may be provided by display graphics that do not require use of LEDs or EL panels. For example, e-ink pads or sources may be used to display graphics for individual keys. As another variation, electrophoretic displays may also be used for purpose of generating graphics on keys (e.g. displaying character assignments in a particular mode).

Stack-Ups

Figure 3:
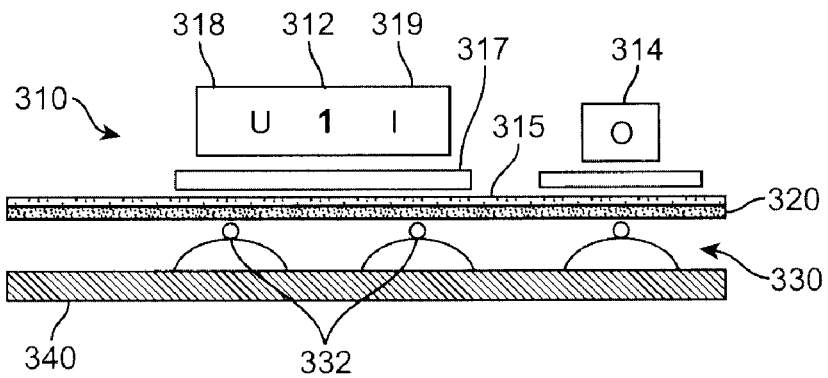
FIG. 3 is a representative side cross-sectional view of a keypad of a computing device that incorporates an enlarged multi-letter, single number key.

FIG. 3 is a representative side cross-sectional view of a keypad of a computing device that incorporates an enlarged multi-letter, single number key. In an embodiment, a keycap layer 310 is positioned over an illumination layer 320 and a detector layer 330. The detector layer 330 is provided on a circuit board 340 that interconnects the detector layer 330 to processing resources of the computing device.

The keycap layer 310 includes elements such as keycap 312 (enlarged), keycap 314, base structures 317 (or plungers) and carriers 315 to support the keycaps in an operative position. Alternative implementations may, for example, omit the use of carriers, or integrate the keycap layer with one or more other layers, such as the detector layer 330.

The illumination layer 320 can be comprised of either discrete elements, such as light emitting diodes (LEDs), or continuous illumination elements such electroluminescent panels. Still further, the illumination layer 320 can correspond to a display panel (e.g. LCD, OLED) that can be driven to emit content with illumination, so as to provide for example, content corresponding to letter or numeric values of individual keys.

In an embodiment, the detector layer 330 comprises a plurality of electrical switches 332 which can be triggered or actuates to register a key strike. As examples, the electrical switches 332 may correspond to snap-dome contact elements, which provide an inherent tactile response when actuated. As an alternative to snap-dome elements, variations may include use of rocker switches or tabs. For enlarged keys 312, one embodiment provides that separate electrical switches 332 are provided under each side of the enlarged keycap, so that each electrical switch underlies a portion of the keycap that is assigned a corresponding letter value. In letter entry mode, the user presses one of the portion 318, 319 of the enlarged keycap 312. When the portion of the enlarged keycap is pressed, the electrical contact 332 underlying that portion 318, 319 is actuated, so as to register the letter value of that portion of the keycap. In alternative or numeric entry mode, the user can press either portion of the keycap 312, as well as the center region. As long as one of the electrical contact elements is actuated, the corresponding numerical value of the keycap 312 is registered.

Figure 4:
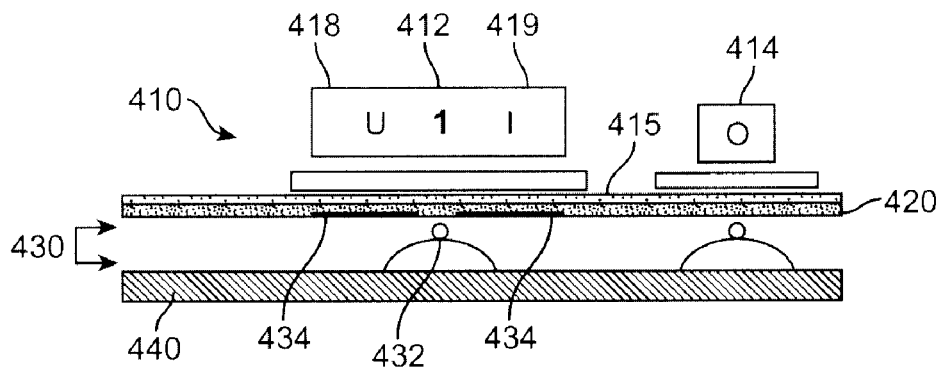
FIG. 4 illustrates an alternative construction for implementing a keycap that includes enlarged multi-letter, single number keys.

FIG. 4 illustrates an alternative construction for implementing a keycap that includes enlarged multi-letter, single number keys. In an embodiment, the construction of a keypad such as shown by FIG. 4 is similar to that described with FIG. 3, in that a keycap layer 410 is positioned over an illumination layer 420 and a detector layer 430, and detector layer 430 is provided on a circuit board 440 that interconnects elements of the detector layer 430 to processing resources of the computing device. The keycap layer 410 and the illumination layer 420 can be constructed as described with embodiments of FIG. 3. The detector layer 430 includes a combination of electrical contact elements 432 and sensors 434. More specifically, each enlarged keycap is positioned over a single electrical contact 432 that actuates whenever any portion of the keycap is pressed. Additionally, sensors 434 are positioned to detect whether the user's contact is with a left 418 or right portion 419 of the enlarged keycap 412. In letter entry mode, the user may press the enlarged keycap. If the contact is sufficient to trigger the electrical contact element 432, the position of the finger (or object) that makes contact with the keycap is determined from the sensors 434 in order to determine which letter value to register from the user contact. In numeric entry mode, the user presses either side of the keycap. If the contact element 432 is actuated, the numeric value assigned to that keycap is registered.

Figure 5:
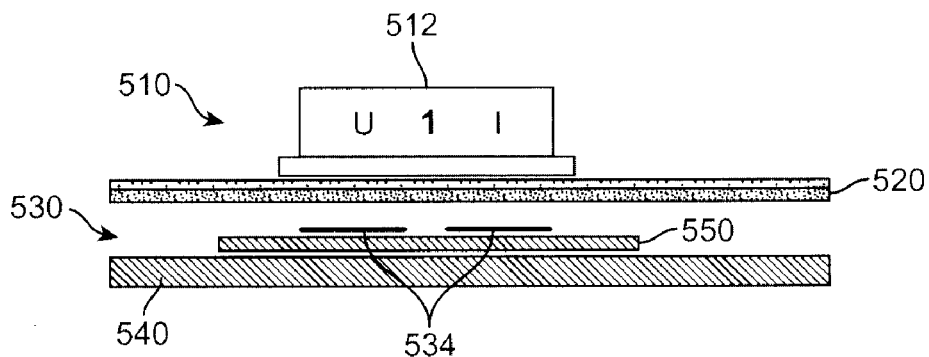
FIG. 5 illustrates another variation for implementing a keypad that include enlarged multi-letter, single value keys.

FIG. 5 illustrates another variation for implementing a keypad that include enlarged multi-letter, single value keys. In an embodiment, the construction of a keypad such as shown by FIG. 5 is similar to that described with FIG. 3 or FIG. 4. In an embodiment, a keycap layer 510 is positioned over an illumination layer 520 and a detector layer 530, and detector layer 530 is provided on a circuit board 540 that interconnects elements of the detector layer 530 to processing resources of the computing device. The keycap layer 510 and the illumination layer 520 are constructed as described with embodiments of FIG. 3 and FIG. 5. In embodiment shown by FIG. 5, the detector layer 530 includes sensors 534, but omits electrical contact elements. In addition to sensors 534, the keypad includes haptic feedback mechanisms 550. The sensors 534 detect which portion of the enlarged keycap 512 the user pressed or made contact with. The haptic feedback mechanisms 550 can, for example, vibrate or 'click' (and/or release an audible) to provide tactile response when the user makes contact with the keycap 512. In the letter entry mode, the letter value of the key strike is determined by which portion of the keycap 512 that the sensors 534 detected as being contacted by the user. In the numeric entry mode, contact with any region of the keycap 512 registers the numeric value of that keycap.

As an alternative or variation to use of sensors or snap domes (or alternative switches such as rockers), enlarged keycaps may be aligned with circuitry that detects which side of the keycap traveled inward a certain distance. Each portion of the keycap may be aligned with such circuitry that 'breaks' or detects when a threshold travel occur. In the event both portions travel as a result of keystrike, the circuitry may be used to detect which portion of the keycap traveled inward first. The letter value assigned to the first circuit to 'break' is processed as the letter value for the key-strike.

With respect to embodiments such as described with FIG. 3 through FIG. 5, the various detector or sensor layer may correspond to, for example, a capacitive sensing element that can detect touch or close proximity of human skin. Such capacitive surfaces or elements may be provided underneath the key structures. In one implementation, for example, the key structures overlay one or more capacitive sensing surfaces.

Hardware Diagram

Figure 6:
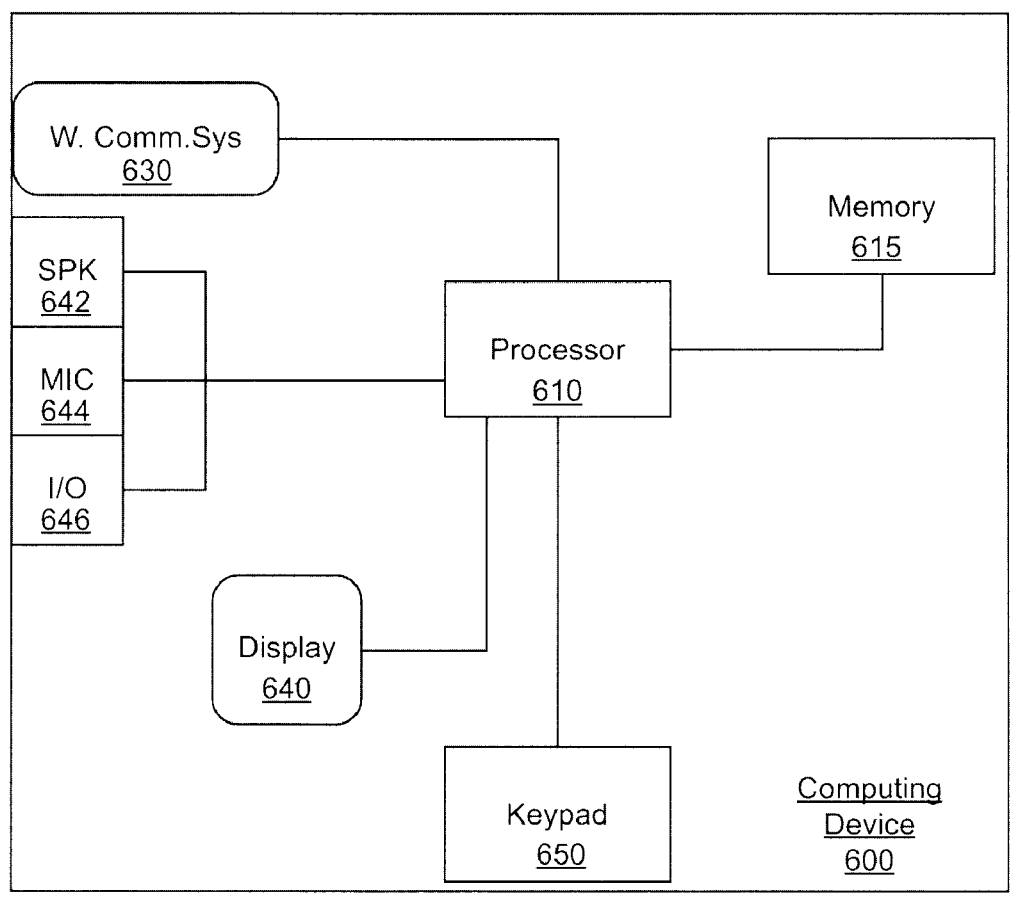
FIG. 6 illustrates a hardware diagram for a computing device that is configured to support any of the embodiments described herein.

FIG. 6 illustrates a hardware diagram for a computing device that is configured to support any of the embodiments described herein. An embodiment of FIG. 6 is depicted as a mobile computing device 600, which may correspond to any device that includes roaming wireless network and/or telephony capabilities, including cellular telephony devices and/or mobile messengers. In particular, embodiments described herein may apply to numerous kinds of mobile or small form-factor computing devices. One type of mobile computing device that may be configured to include embodiments described herein includes a computer telephony device, such as a cellular phone or mobile device with voice-telephony applications (sometimes called "smart phone"). A computing device such as described may be small enough to fit in one hand, while providing cellular telephony features in combination with other applications, such as messaging, web browsing, media playback, personal information management (e.g. such as contact records management, calendar applications, tasks lists), image or video/media capture and other functionality. Mobile computing devices in particular may have numerous types of input mechanisms and user-interface features, such as keyboards or keypads, multi-directional or navigation buttons, application or action buttons, and contact or touch-sensitive display screens. Some devices may include combinations of keyboard, button panel area, and display screen (which may optionally be contact-sensitive) on one façade. The button panel region may occupy a band between the keypad and the display area, and include a navigation button and multiple application buttons or action buttons.

Specific types of messaging that may be performed includes messaging for email applications, Short Message Service (SMS) messages, Multimedia Message Service (MMS) messages, and proprietary voice exchange applications (such as SKYPE). Still further, other types of computing device contemplated with embodiments described herein include laptop or notebook computers, ultra-mobile computers, personal digital assistants, and other multi-functional computing devices.

Still further, some implementations include personal computers that are configured to include real-time voice data exchange (e.g. through use of Internet Protocol telephony). Still further, other types of computer telephony devices exist, including standalone devices that connect directly to a telephone network (whether Internet Protocol or Public Switch Telephony System (PSTN)) and provide software interfaces and applications.

According to an embodiment, the device 600 may include one or more processors 610 (as processing resources), memory resources 615, one or more wireless communication ports 630, and various other input/output features, including a display assembly 640, a speaker 642, a microphone 644 and other input/output mechanisms 646. The display assembly 640 may be contact-sensitive (to detect presence of objects), and more specifically, touch-sensitive, to detect presence of human skin. The display assembly 640 can alternatively include optical sensors to detect objects such as fingers, placed on or near the display surface. According to some embodiments, the display assembly 640 is one interface by which the user can enter input movements using a finger or object, in order to interact with applications and application content.

According to an embodiment, the keypad 650 is constructed in accordance with any of the embodiments described above. The keypad 650 may include, for example, detector elements (e.g. sensor or electrical contact), illumination components to selectively illuminate the components of the keypad. In one embodiment, the illumination components correspond to portions of the display 640. In other embodiments, a separate LCD is provided. Still further, other forms of illumination, such as EL panels or LEDs may be used to illuminate the keys of the keypad. Still further, some embodiments provide that the keypad includes a haptic component to provide tactile feedback of user contacts. For example, the keypad 650 may include force sensors for detectors, as well as one or more haptic components to replicate a "snap-dome" feel when the individual keys are pressed.

In other embodiments, the keypad is virtual, and the processor generates display content that emulates the keypads, such as described with embodiments of FIG. 2A through FIG. 2E, or elsewhere in this application.

It is contemplated for embodiments described herein to extend to individual elements and concepts described herein, independently of other concepts, ideas or system, as well as for embodiments to include combinations of elements recited anywhere in this application. Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. This, the absence of describing combinations should not preclude the inventor from claiming rights to such combinations.

What is claimed is:

1. A mobile computing device comprising:
a keypad comprising a plurality of keys;
a processor that is coupled to control use of the keypad, including to enable use of the keypad in each of a letter entry mode or an alternative entry mode;
wherein the plurality of keys include a subset of keys, each key in the subset being (i) enlarged as compared to other keys of the keypad that are not part of the subset, (ii) assigned m letter values for when the keypad is operated in the letter entry mode, and (iii) assigned n numeric values, where 1≦n<m, for when the keypad is operated in the alternative entry mode;

wherein the keypad is structured to distinguish, for each key in the subset, contact made at a left region of that key versus contact made at a right region of the key;

wherein in the letter entry mode, the processor identifies a first letter value when contact is made at the left region, and a second letter value when contact is made at the right region; and wherein in the alternative entry mode, the processor identifies a first numeric value when contact is made at the left region, the right region, or both of the left region and the right region.

2. The mobile computing device of claim 1, wherein m is 2 and n is 1.

3. The mobile computing device of claim 1, wherein each key in the subset includes a first detector being positioned with the left region to detect contact made at the left region and a second detector being positioned with the right region to detect contact made at the right region, and wherein each key of the other keys of the keypad that are not part of the subset includes a single detector.

4. The mobile computing device of claim 2, wherein the subset of keys is centered relative to a boundary of the keypad.

5. The mobile computing device of claim 1, further comprising one or more illumination sources that illuminate at least a portion of the keypad.

6. The mobile computing device of claim 5, wherein the one or more illumination sources is coupled to the processor and controlled by the processor to differentiate illumination of different portions of each key in the subset of keys.

7. The mobile computing device of claim 1, wherein the keypad is formed from a plurality of key structures.

8. The mobile computing device of claim 5, wherein the one or more illumination sources is coupled to the processor and controlled by the processor to selectively (i) illuminate only a portion of each key in the subset that displays a numeric value, and (ii) not illuminate another portion of each key in the subset that displays a letter value, so that the numeric value of each key in the subset is illuminated and the letter values of each key in the subset is not illuminated.

9. The mobile computing device of claim 8, wherein each key in the subset includes one or more surface features that are formed to be (i) visible with selectively illumination that displays any one of multiple alphanumeric characters, (ii) not apparent or visible when no illumination is present.

10. A mobile computing device comprising:
a keypad assembly including:
a layer of key structures to provide a plurality of keys, including a subset of keys that are (i) enlarged as compared to other keys of the plurality of keys that are not part of the subset, (ii) assigned m letter values for when the plurality of keys is operated in a letter entry mode, and (iii) assigned n numeric values, where 1≦n<m, for when the plurality of keys is operated in an alternative entry mode;

a plurality of detectors positioned beneath the layer of key structures, wherein (i) for each key in the subset of keys, a first detector is positioned beneath a first region of the key and a second detector is positioned beneath a second region of the key to distinguish contact made at the first region of the key versus contact made at the second region the key, and (ii) for each key of the other keys of the plurality of keys that are not part of the subset, a single detector is positioned beneath the key;

a processor that is coupled to control use of the keypad, including to enable use of the keypad in each of the letter entry mode or the alternative entry mode.

11. The mobile computing device of claim 10, wherein each of the plurality of detectors includes an electrical contact element.

12. The mobile computing device of claim 10, wherein each of the plurality of detectors includes a sensor.

13. The mobile computing device of claim 10, wherein each of the plurality of detectors includes a combination of an electrical contact element and a sensor.

14. The mobile computing device of claim 10, wherein the processor and keypad assembly combine to enable, in the letter entry mode, each key of the subset to be contacted to identify (i) a first letter value when contact is made at the first region of that key, (ii) a second letter value when contact is made at the second region of that key.

15. The mobile computing device of claim 14, wherein the processor and keypad assembly combine to enable, in the alternative entry mode, each key of the subset to be contacted to identify a corresponding numeric value, regardless of whether contact is made in the first region, the second region, or both of the first region and the second region.

16. The mobile computing device of claim 10, wherein the keypad assembly includes an illumination layer positioned under the key structure layer.

17. The mobile computing device of claim 15, wherein the keypad assembly includes an illumination layer positioned under the key structure layer, the illumination layer comprising one or more elements that independently illuminate, for each key of the subset, (i) at least one of a first letter character of the first region or a second letter character of the second region, without illuminating a number character of that key, when the keypad is operated in the letter entry mode; (ii) the number character of that key, without illuminating the first letter character of the first region or the second letter of the second region, when the keypad is operated in the alternative entry mode.

18. The mobile computing device of claim 17, wherein the elements of the illumination layer include (i) a light emitting diode, or (ii) an electroluminescent layer.

19. The mobile computing device of claim 10, wherein m is 2 and n is 1.

* * * * *

UNITED STATES PATENT AND TRADEMARK OFFICE
CERTIFICATE OF CORRECTION

PATENT NO. : 8,350,728 B2
APPLICATION NO. : 12/766828
DATED : January 8, 2013
INVENTOR(S) : Eric Liu et al.

It is certified that error appears in the above-identified patent and that said Letters Patent is hereby corrected as shown below:

In column 10, line 10, in Claim 10, after "region" insert -- of --.

Signed and Sealed this
Second Day of April, 2013

Teresa Stanek Rea
*Acting Director of the United States Patent and Trademark Office*